(12) United States Patent
Burda et al.

(10) Patent No.: US 6,320,419 B1
(45) Date of Patent: Nov. 20, 2001

(54) NON-LATENCY AFFECTED CONTENTION PREVENTION DURING SCAN-BASED TEST

(75) Inventors: Gregory Christopher Burda, Holly Springs; Jeffrey Herbert Fischer, Cary; Robert Anthony Paniccia, Raleigh, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/678,971

(22) Filed: Oct. 4, 2000

(51) Int. Cl.$^7$ .................................................. H03K 19/00
(52) U.S. Cl. ............................... 326/93; 326/16; 714/727
(58) Field of Search .............................. 326/93–98, 21, 326/16; 714/724–731

(56) References Cited

U.S. PATENT DOCUMENTS

| | | |
|---|---|---|
| 4,236,246 | 11/1980 | Skilling . |
| 4,855,669 * | 8/1989 | Mahoney ................................ 371/20 |
| 5,572,535 | 11/1996 | Pixley et al. . |
| 5,619,511 * | 4/1997 | Sugisawa et al. .................. 371/22.3 |
| 5,648,733 | 7/1997 | Worrell et al. . |
| 5,715,256 | 2/1998 | Mohd et al. . |
| 5,732,091 | 3/1998 | Whetsel . |
| 5,909,452 | 6/1999 | Angelotti . |
| 6,223,313 * | 4/2001 | How et al. ............................ 714/724 |

OTHER PUBLICATIONS

IBM Technical Disclosure Bulletin, "Method and Design For Applying Stuck Faults In An LSSD Boundary Scan Environment", vol. 34, No. 10B, Mar. 1992.

* cited by examiner

Primary Examiner—Michael Tokar
Assistant Examiner—Don Phu Le
(74) Attorney, Agent, or Firm—Sawyer Law Group LLP

(57) ABSTRACT

The present invention provides a method and system for a contention prevention scheme which provides contention prevention during scan-based test without adversely affecting the functional timing of the path circuit. The contention prevention scheme provides a circuit which includes a path circuit gated by a contention prevention circuit (CPC) and the CPC, where the CPC allows functional operation to occur without adversely affecting the functional operation timing, provided that a time skew between two input signals to the CPC is approximately less than a difference between a time delay associated with a scan-based test logic value and a time delay associated with a functional logic value. With a contention prevention circuit tuned in this manner, a static logical value during functional mode is provided, indicating no contention, which avoids adversely affecting the functional timing of the path circuit.

11 Claims, 6 Drawing Sheets

NON-LATENCY AFFECTED CONTENTION PREVENTION DURING SCAN-BASED TEST

FIELD OF THE INVENTION

The present invention relates to the testing of electronic circuitry, and more particularly to contention prevention in the testing of electronic circuitry.

BACKGROUND OF THE INVENTION

Many schemes for the testing of circuitry exist in the art. One type of test is the "scan-based" test, which scans values into latches which drives the input signals to a path circuit. Each node in the path circuit may be written by one of a multiple of sources. However, when the same node is being written from multiple sources at the same time during scan-based testing, contention occurs, which causes erroneous data to be output from the path circuit. A contention prevention scheme is thus required to avoid this problem.

Many of the conventional contention prevention schemes require the contention prevention circuit (CPC) to be located in the functional timing path of the path circuit. FIG. 1 illustrates a timing diagram for a conventional skewed write clock scheme for contention prevention. This scheme, typically used in multi-port memory arrays, uses skewed write clock signals for skewed write wordline generation. For n number of write ports in the multi-port memory array, n number of write clock signals could be generated for the same address. For example, FIG. 1 illustrates the clock signals, WCLKA 102, WCLKB 104, and WCLKC 106, for three ports A, B, and C (not shown). The ports follow their respective clock signals 102, 104, 106. Assume that the ports are written when their respective clock signals transition from low to high. By providing skewed clock signals, port A is written first, then port B, and then port C, but not at the same time. However, with this scheme, functional timing of the path circuit is adversely affected since the CPC implementing this scheme would be in the path of the path circuit. Also, as n increases, the functional timing becomes more adversely affected.

FIG. 2 illustrates a timing diagram for a conventional overlapped write clock scheme for contention prevention. In this scheme, overlapping write clock signals are used for the multi-port memory arrays. Again, as with the skewed write clock scheme illustrated in FIG. 1, n number of write clock signals could be generated for the same address. For example, the clock signals, WCLKA 202, WCLKB 204, and WCLKC 206, are for three ports A, B, and C (not shown). When more than one clock signal is high, there is contention and no port is written. Thus, when WCLKA 202 transitions low, contention remains between ports B and C. When WCLKB 204 transitions low, only WCLKC 206 remains high. Since now there is no contention, port C is written. However, this scheme does not prevent contention during scan-based test. It also adversely affects the functional timing of the path circuit in the same manner as the skewed write clock scheme, described above.

FIG. 3 illustrates a conventional gated wordline driver scheme for contention prevention. FIG. 3 shows a CPC 300 which implements the scheme. With this scheme, only one wordline driver is active at any one time. For example, WCLKA 302, WCLKB 304, and WCLKC 306 are the write wordline drives for ports A, B, and C (not shown), respectively, of the multi-port memory array. The CPC 300 prevents WCLKC 306 from becoming active unless WCLKA 302 and WCLKB 304 are both inactive. Thus two or more wordlines are not allowed to be active at the same time, preventing possible contention on the latch node of the memory cell. In this example, port A has the highest priority to write, followed by port B and then port C. However, as the n number of write ports increases, more "legs" must be added to the CPC 300 as the number of low-priority wordline drivers increases to n–1. Thus, functional timing of the path circuit is adversely affected.

Other conventional contention prevention schemes include the use of test clocks separate from the write clocks. With this scheme, test timing assertions guarantee that two of the test clocks are never active at the same time. However, as the number of write ports increase, the number of separate test clocks increases. Also, this scheme requires extra primary inputs at the chip level. Typically only a certain amount of test-related primary inputs are allowed at the chip level.

Accordingly, there exists a need for a method and system for a contention prevention scheme which provides contention prevention during scan-based test without adversely affecting the functional timing of the path circuitry. The present invention addresses such a need.

SUMMARY OF THE INVENTION

The present invention provides a method and system for a contention prevention scheme which provides contention prevention during scan-based test without adversely affecting the functional timing of the path circuit. The contention prevention scheme provides a circuit which includes a path circuit gated by a contention prevention circuit (CPC) and the CPC, where the CPC allows functional operation to occur without adversely affecting the functional operation timing, provided that a time skew between two input signals to the CPC is approximately less than a difference between a time delay associated with a scan-based test logic value and a time delay associated with a functional logic value. With a contention prevention circuit tuned in this manner, a static logical value during functional mode is provided, indicating no contention, which avoids adversely affecting the functional timing of the path circuit.

DETAILED DESCRIPTION

The present invention provides a method and system for a contention prevention scheme which provides contention prevention during scan-based test without adversely affecting the functional timing of the path circuitry. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

A contention prevention scheme in accordance with the present invention provides a contention prevention circuit (CPC) which prevents contention during scan-based test mode. The CPC is tuned such that it provides a static logical value during function mode, indicating no contention, which avoids adversely affecting the functional timing of the path circuitry, provided that the difference between the time delay through the CPC associated with a scan-based test logic value and a time delay through the CPC associated with a functional logic value is greater than a time skew between two inputs to the CPC.

To more particularly describe the features of the present invention, please refer to FIGS. 4 through 11 in conjunction with the discussion below.

Figure 1:
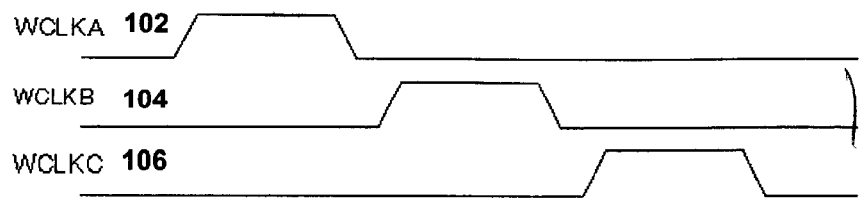
FIG. 1 illustrates a timing diagram for a conventional skewed write clock scheme for contention prevention.
Figure 2:
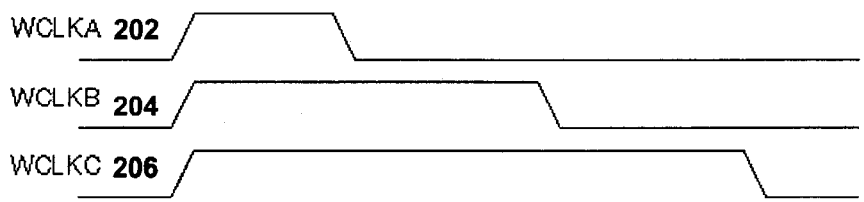
FIG. 2 illustrates a timing diagram for a conventional overlapped write clock scheme for contention prevention.
Figure 3:
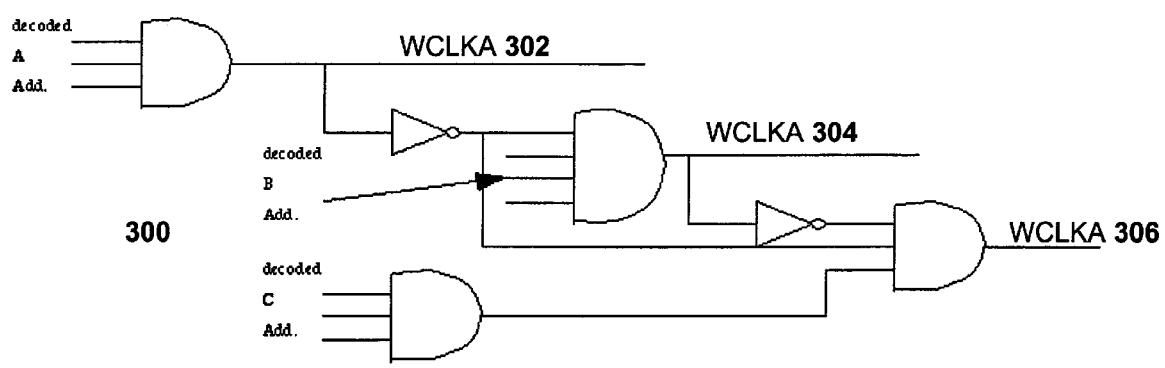
FIG. 3 illustrates a conventional gated wordline driver scheme for contention prevention.
Figure 4:
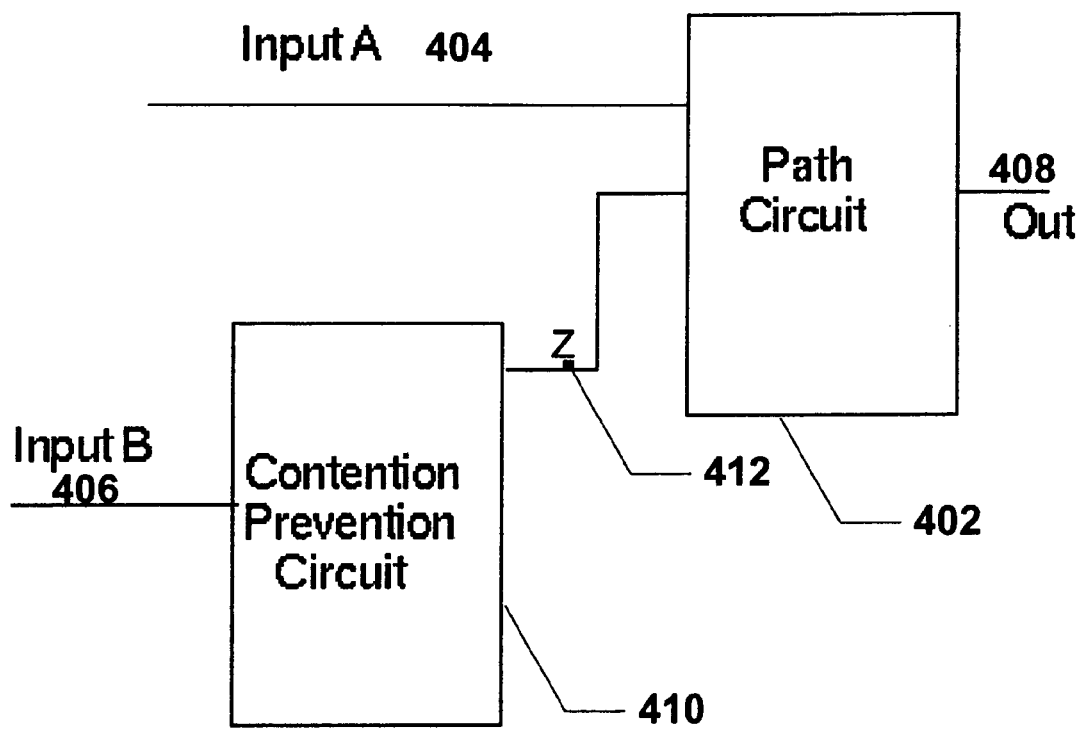
FIGS. 4 and 5 are a block diagram and a timing diagram, respectively, illustrating a preferred embodiment of a contention prevention scheme in accordance with the present invention.
Figure 5:
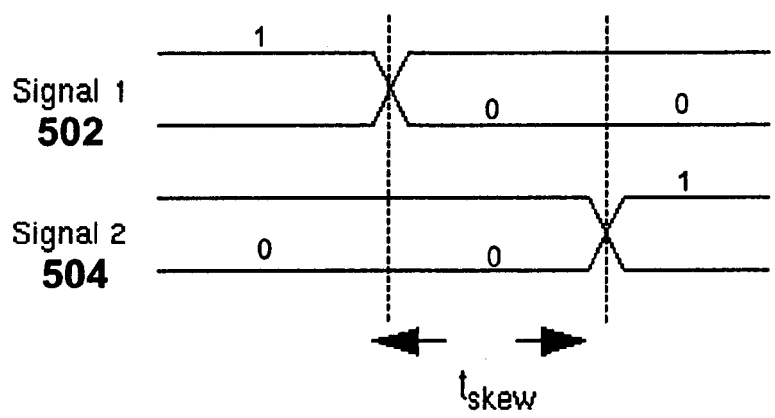

FIGS. 4 and 5 are a block diagram and a timing diagram, respectively, illustrating a preferred embodiment of a contention prevention scheme in accordance with the present invention. Referring to FIG. 4, the contention prevention scheme includes a path circuit 402 which processes inputs A 404 and B 406 and provides an output 408. A CPC 410 resides between input B 406 and the path circuit 402. In the preferred embodiment, the path circuit 402 is guaranteed to not experience contention while in the functional mode. However, during scan-based test mode, contention is possible. With the contention prevention scheme in accordance with the present invention, the CPC 410 is "invisible" to the path circuit 402 during the functional mode, thus leaving the input A 404 to output 408 timing virtually unaffected. At the same time, the CPC 410 provides contention prevention during the scan-based test mode. The output node Z 412 of the CPC 410 has a given logical value when contention occurs and an opposite value when contention does not occur. The CPC 410 has a time delay, $t_{functional}$, associated with functional cases of input B 406. It also has a time delay, $t_{test}$ associated with test cases of input B 406.

Assume for illustrative purposes that a "1", or high, state at node Z 412 indicates that there is no contention, while a "0", or low, state at node Z 412 indicates that there is contention. Referring to FIG. 5, the time gap between two signals 502, 504 at input B 406 is $t_{skew}$. Assume that the path circuit 408 is in the functional mode. The signals 502, 504 contend during $t_{skew}$ but do not contend before or after $t_{skew}$. This means that during $t_{skew}$, the node Z 412 would switch from a "1" state to a "0" state, and then switch back to a "1" state after $t_{skew}$, causing a test only state to occur on node Z 412 during functional mode. However, if $(t_{test}-t_{functional}) > t_{skew}$, then the logical value associated with the contention case of input B 406 will not propagate to the node Z 412.

With a $t_{skew}$ smaller than $t_{test-tfunctional}$, the functional delay through the CPC 410 due to signal 504 transitioning at the end of $t_{skew}$ in FIG. 5 will overtake the test delay through the CPC 410 due to signal 502 transitioning at the beginning of $t_{skew}$. Thus, node Z 412 does not switch to a "0" state during $t_{skew}$. In this manner, during functional mode, node Z 412 remains at a high state, allowing the path circuit 402 to process input A 404 without being adversely affected by the CPC 410.

If both signals 502 and 504 were scanned such that contention did in fact occur, then contention can be recognized by the CPC 410. Node Z 412 will have a state of "0", preventing input B 406 from propagating to the path circuit 408. Since it is desirable for $t_{test}$ to be large with respect to $t_{functional}$, the state "0" would occur late in time. This is acceptable since scan-based test is typically performed at a low frequency.

Figure 6:
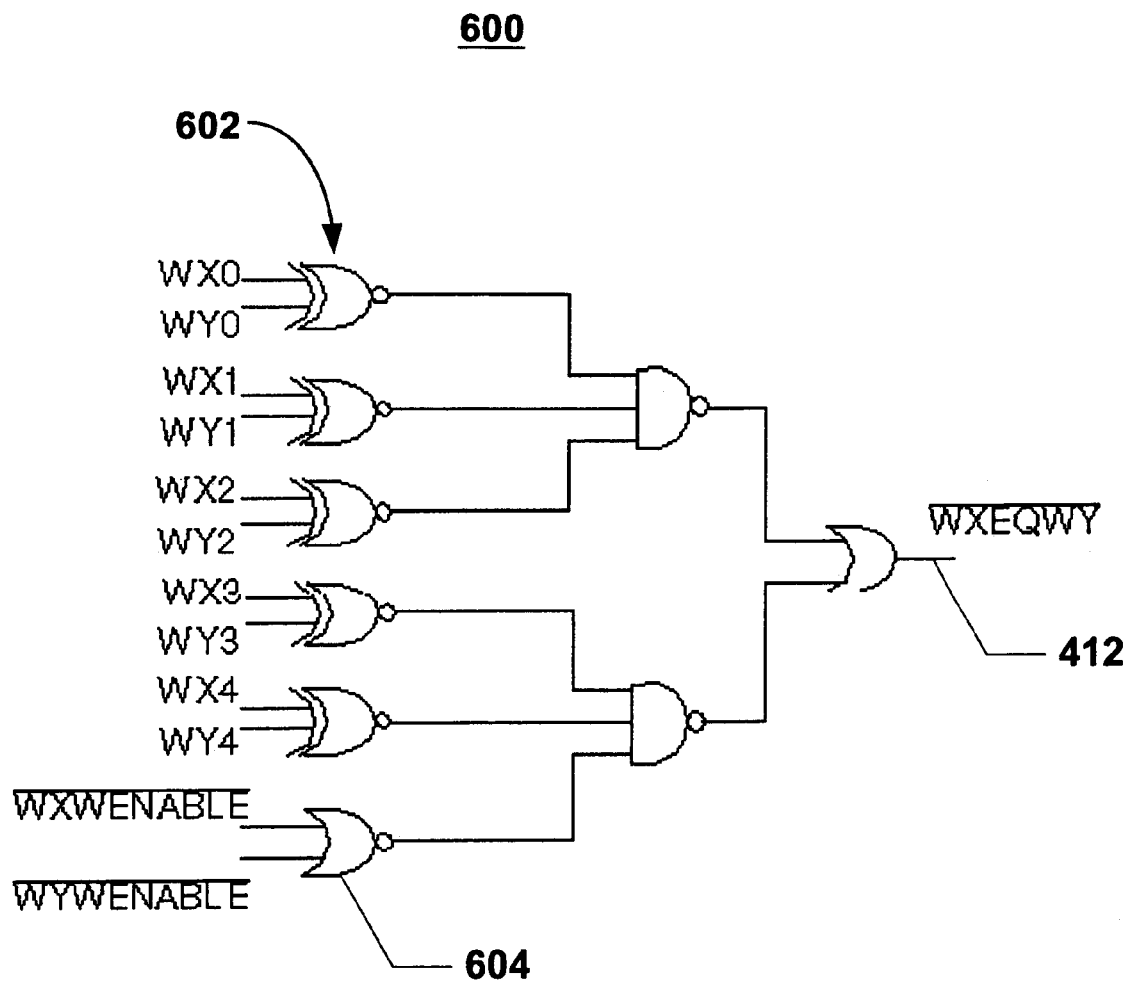
FIG. 6 illustrates a preferred embodiment of a contention prevention circuit implementing the contention prevention scheme in accordance with the present invention.

FIG. 6 illustrates a preferred embodiment of a contention prevention circuit implementing the contention prevention scheme in accordance with the present invention. The CPC 600 is a skewed-CMOS address and enable comparison circuit. A set of "exclusive-not-or" (XNOR) gates 602 compare each bit of two addresses, X and Y. The "not-or" (NOR) gate 604 has as inputs a WXWENABLE-bar and a WYWENABLE-bar signal, indicating if the X and Y addresses, respectively, are enabled for a write. The CPC 600 outputs a WXEQWY-bar signal at node Z 412. In the preferred embodiment, during the functional mode, the addresses X and Y miscompare, or addresses X and Y compare but one or more is disabled, and the WXEQWY-bar signal has a "1" or non-contention state at node Z 412. During scan-based test mode, if X and Y compare, i.e., they are the same address, and the WXWENABLE and WWENABLE signals indicate they are both enabled to write, then WXEQWY-bar has a "0" or contention state at node Z 412. With the CPC 600, the miscompare circuit path is the $t_{functional}$ while the compare circuit path is the $t_{test}$. The CPC 600 is tuned such that a miscompare propagates more quickly than a compare, according to the equation $(t_{test}-t_{functional}) > t_{skew}$, as described above.

Figure 7:
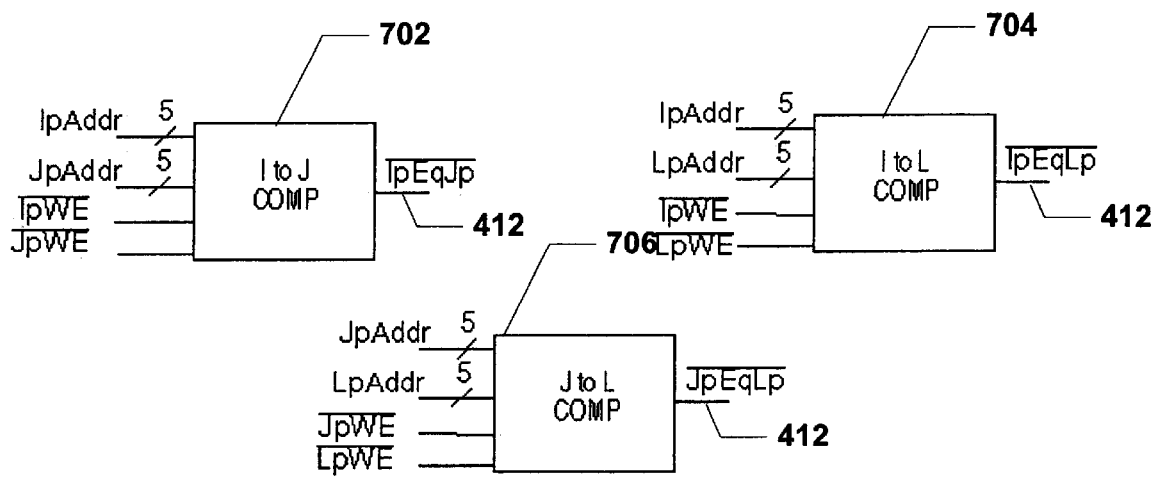
FIG. 7 illustrates an example three-port contention prevention circuit implementing the contention prevention scheme in accordance with the present invention.

FIG. 7 illustrates an example three-port contention prevention circuit implementing the contention prevention scheme in accordance with the present invention. In this example, assume there are three ports, "I", "J", and "L". Three CPC's, such as the CPC 600 illustrated in FIG. 6, are used to determine if there is contention between any of the three ports. Assume also that port I has the highest priority, port J has the next highest priority, and port L has the lowest priority. Three renditions of the CPC 600 are used as an I to J comparator 702, an I to L comparator 704, and a J to L comparator 706. As the I to J comparator 702, the addresses of ports I (IpAddr) and J (JpAddr) are compared by the XNORs 602. The IpWE and JpWE signals indicate if ports I and J, respectively, are enabled to be written. If IpAddr and JpAddr compare, and both are enabled, then the IpEqJp-bar signal has a "0" state at node Z 412. If they miscompare, then the IpEqJp-bar signal has a "1" state at node Z 412.

As the I to L comparator 704, the addresses of ports I (IpAddr) and L (LpAddr) are compared by the XNORs 602. The IpWE and LpWE signals indicate if ports I and L, respectively, are enabled to be written. If IpAddr and LpAddr compare, and both are enabled, then the IpEqLp-bar signal has a "0" state at node Z 412. If they miscompare, then the IpEqLp-bar signal has a "1" state at node Z 412.

As the J to L comparator 706, the addresses of ports J (JpAddr) and L (LpAddr) are compared by the XNORs 602.

The JpWE and LpWE signals indicate if ports J and L, respectively, are enabled to be written. If JpAddr and LpAddr compare, and both are enabled, then the JpEqLp-bar signal has a "0" state at node Z 412. If they miscompare, then the JpEqLp-bar signal has a "1" state at node Z 412.

Figure 8:
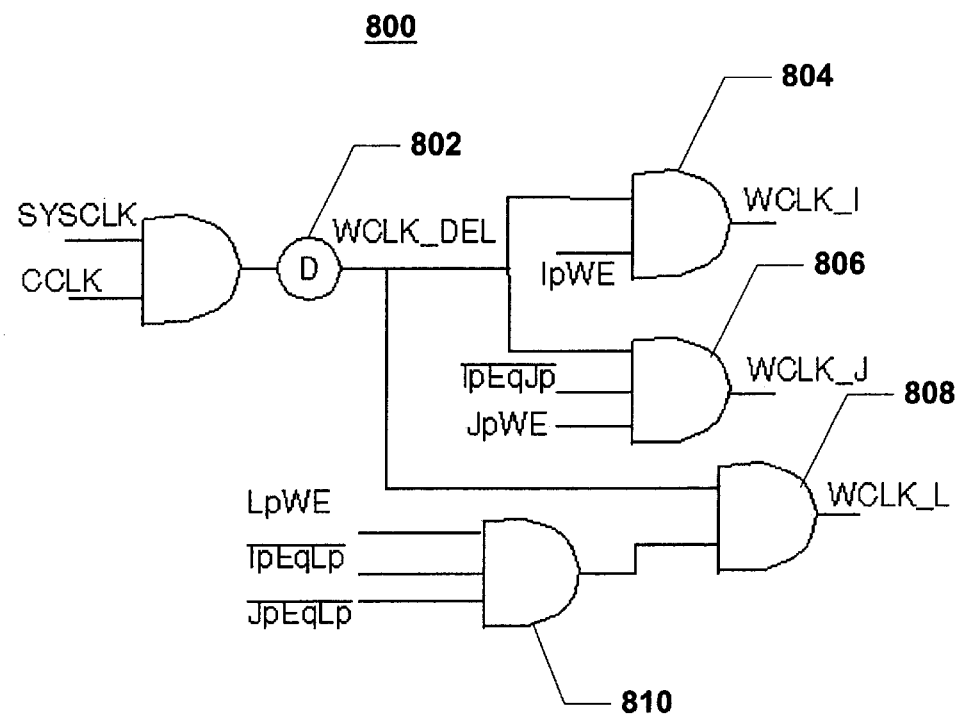
FIG. 8 illustrates a portion of an example path circuit utilizing in the contention prevention scheme in accordance with the present invention.

FIG. 8 illustrates a portion of an example path circuit utilizing in the contention prevention scheme in accordance with the present invention. Continuing with the example three port CPC illustrated in FIGS. 6 and 7, the IpEqJp-bar, IpEqLp-bar, JpEqLp-bar signals are input into the path circuit 800 at AND gates 806 and 810, as shown. WCLK_I, WCLK_J, and WCLK_L are clock signals which drive the writing of port I, port J, and port L respectively. The SYSCLK signal generates these clock signals. The CCLK signal pulses once during a scan-based test. The D element 802 is a physical delay element timed, along with the AND gates 804, 806, and 808, to be slightly greater than the write decoder path.

If ports I and J are both enabled and their addresses compare, then the I to J comparator 702 outputs an IpEqJp-bar signal with a "0" state to the AND gate 806, the IpWE signal outputs a "1" state to the AND gate 804, and the JpWE signal outputs a "1" state to the AND gate 806. The AND gate 806 thus blocks the WCLK_J signal while allowing the WCLK_I signal to be generated by the AND gate 804. Contention between ports I and J is thus prevented.

If ports I and L are both enabled and their addresses compare, then the I to L comparator 704 outputs an IpEqLp-bar signal with a "0" state to the AND gate 810, the IpWE signal outputs a "1" state to the AND gate 804, and the LpWE signal outputs a "1" state to the AND gate 810. The AND gate 808 thus blocks the WCLK_L signal while allowing the WCLK_I signal to be generated by the AND gate 804. Contention between ports I and L is thus prevented.

If ports J and L are both enabled and their addresses compare, then the J to L comparator 706 outputs an JpEqLp-bar signal with a "0" state to the AND gate 810, the JpWE signal outputs a "1" state to the AND gate 806, and the LpWE signal outputs a "1" state to the AND gate 810. The AND gate 808 thus blocks the WCLK_L signal while allowing the WCLK_J signal to be generated by the AND gate 806. Contention between ports J and L is thus prevented.

In this manner, contention prevention is provided for scan-based tests without adversely affecting the functional timing of the path circuit. Although the contention prevention scheme in accordance with the present invention is described with the contention prevention and path circuit illustrated in FIGS. 6–8, one of ordinary skill in the art will understand that other convention prevention and path circuits may be used to implement the contention prevention scheme without departing from the spirit and scope of the present invention.

The contention prevention scheme in accordance with the present invention may also be provided with the write-through-read feature of the path circuit 402. When a write and a read is to be performed to the same port, the write-through-read feature forwards the write data directly onto the read bitlines. As with the path circuit 402 as a whole, during scan-based test, it is possible to have multiple write-port data forwarded onto one read bitline, causing contention.

Figure 9:
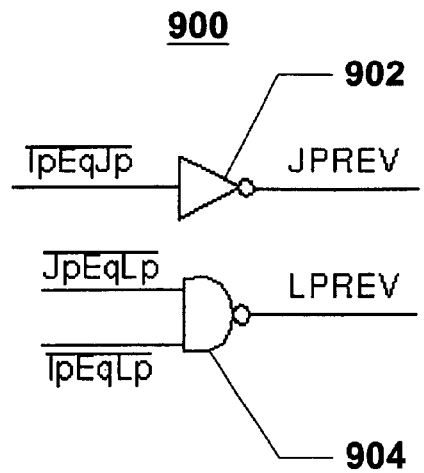
FIG. 9 illustrates a second preferred embodiment of a contention prevention circuit implementing the contention prevention scheme in accordance with the present invention.

FIG. 9 illustrates a second preferred embodiment of a contention prevention circuit implementing the contention prevention scheme in accordance with the present invention. The write-through-read collision logic 900 may be added to the CPC 600 at node Z 412. For illustrative purposes, the three-port example illustrated in FIGS. 6 through 8 is continued. The write-through-read collision logic 900 generates either a JPREV or a LPREV signal, based on the IpEqJp-bar, JpEqLp bar, and IpEqLp-bar signals, as illustrated. If there is contention between ports I and J, the IpEqJp-bar signal is inverted by the inverter 902, outputting a JPREV signal with a "1" state. If there is contention between either ports J and L or ports I and L, the NAND gate 904 outputs a LPREV signal with a "1" state. Either the JPREV or the LPREV signals is then input into a write-through-read comparator circuit in the path circuit 402.

Figure 10:
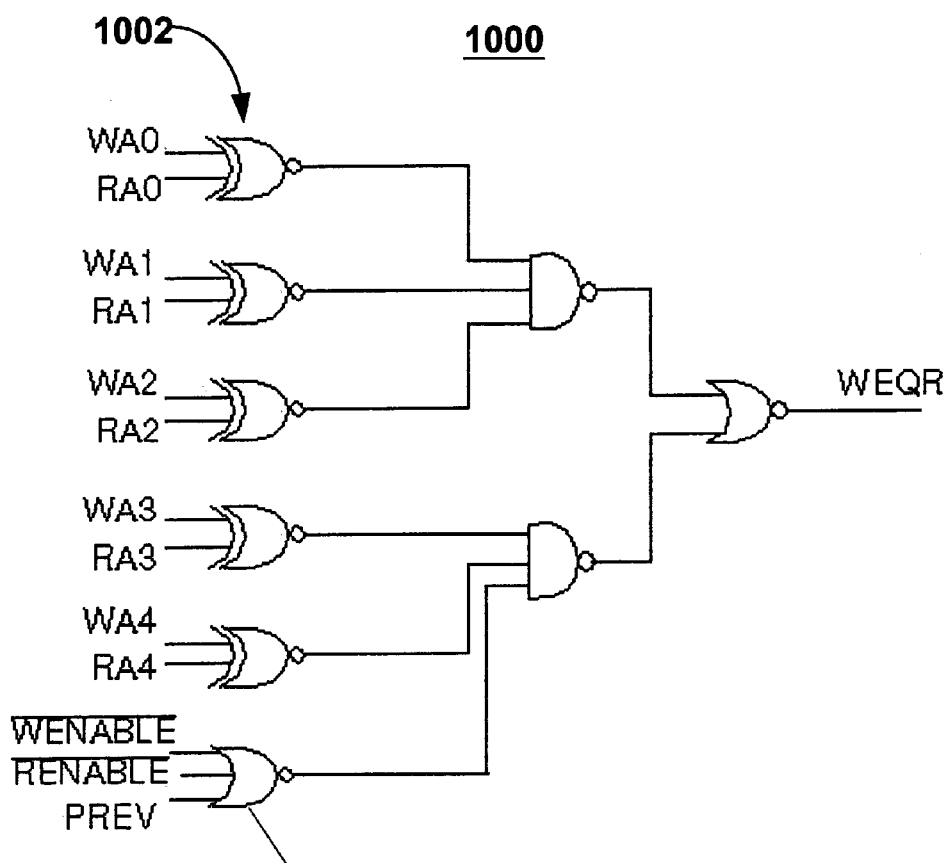
FIG. 10 illustrates a preferred embodiment of a write-through-read comparator circuit utilizing the contention prevention scheme in accordance with the present invention.

FIG. 10 illustrates a preferred embodiment of a write-through-read comparator circuit utilizing the contention prevention scheme in accordance with the present invention. The write-through-read comparator 1000 comprises a set of XNOR gates 1002 to compare the write address, WA, and the read address, RA. The WENABLE-bar signal indicates if the write is enabled, while the RENABLE-bar signal indicates if the read is enabled. The PREV pin in the NOR gate 1004 inputs either ground, the JPREV signal, or LPREV signal. During functional mode, the JPREV and LPREV signals have a "0" state. Thus, if the write and the read addresses compare and are both enabled, then the WEQR signal is output with a "1" state, allowing the write-through-read to occur. If there's contention between any of the ports, then either the JPREV or the LPREV signals will input a "1" state to the PREV pin of NOR gate 1004. This causes the WEQR signal to output a "0" state, blocking the write-through-read, thus preventing contention.

Figure 11:
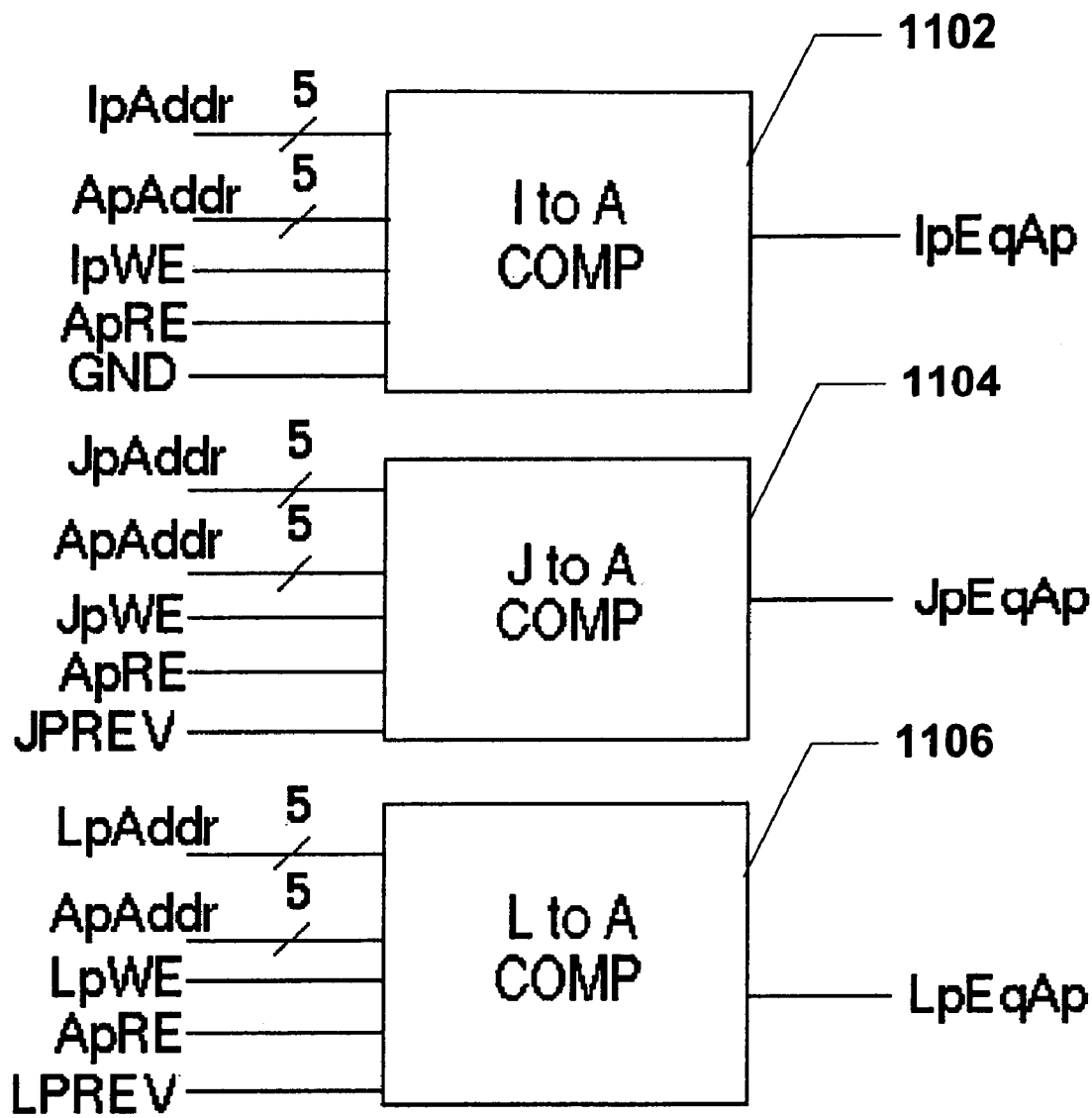
FIG. 11 illustrates a portion of example write-through-read comparators in a path circuit utilizing the contention prevention scheme in accordance with the present invention.

FIG. 11 illustrates a portion of example write-through-read comparators in a path circuit utilizing the contention prevention scheme in accordance with the present invention. For illustrative purposes, the three-port example illustrated in FIGS. 6 through 9 is continued. Three comparators, such as the write-through-read comparator 1000 illustrated in FIG. 10, are used to determine if there is contention between any of the three ports such that write-through-read should not occur. Assume also that port I has the highest priority, port J has the next highest priority, and port L has the lowest priority. Port A is the read port. Three renditions of the write-through-read comparator 1000 is used as an I to A comparator 1102, a J to A comparator 1104, and a L to A comparator 1106. As the I to A comparator 1102, the addresses of ports I (IpAddr) and A (ApAddr) are compared by the XNORs 1102. The IpWE and ApWE signals indicate if ports I and A, respectively, are enabled to be written and read. If IpAddr and ApAddr compare, and both are enabled, then the IpEqAp signal has a "1" state to indicate that a write-through-read is to be performed. Since port I has the highest priority, even if there is contention between port I and another port, it will always be allowed to perform the write-through-read. Thus, its PREV pin is grounded. If they miscompare, then the IpEqAp signal has a "0" state to indicate that no write-through-read is to be performed.

As the J to A comparator 1104, the addresses of ports J (JpAddr) and A (ApAddr) are compared by the XNORs 1102. The JpWE and ApWE signals indicate if ports J and A, respectively, are enabled to be written and read. The JPREV signal from the write-through-read collision logic 900 (FIG. 9), indicates if there is contention between ports I and J. If JpAddr and ApAddr compare, and both are enabled, and the JPREV signal has a "0" state, then the JpEqAp signal has a "1" state to indicate that a write-through-read is to be performed. If JpAddr and ApAddr compare, and both are enabled, and the JPREV signal has a "1" state indicating that IpAddr=JpAddr, then the JpEqAp signal has a "0" state to block the write-through-read. If JpAddr and ApAddr miscompare, then the JpEqAp signal has a "0" state to indicate that no write-through-read is to be performed.

As the L to A comparator 1106, the addresses of ports L (LpAddr) and A (ApAddr) are compared by the XNORs 1102. The LpWE and ApWE signals indicate if ports L and A, respectively, are enabled to be written. The LPREV signal from the write-through-read collision logic 900, indicates if there is contention between ports I and L or between ports J and L. If LpAddr and ApAddr compare, and both are enabled, and the LPREV signal has a "0" state, then the LpEqAp signal has a "1" state to indicate that a write-through-read is to be performed. If LpAddr and ApAddr compare, and both are enabled, and the LPREV signal has a "1" state indicating either LpAddr=IpAddr or LpAddr=JpAddr, then the LpEqAp signal has a "0" state to block the write-through-read. If LpAddr and ApAddr miscompare, then the LpEqAp signal has a "0" state to indicate that no write-through-read is to be performed.

A method and system for a contention prevention scheme which provides contention prevention during scan-based test without adversely affecting the functional timing of the path circuit has been disclosed. The CPC is tuned such that it provides a static logical value during function mode, indicating no contention, which avoids adversely affecting the functional timing of the path circuitry, provided that the difference between the time delay through the CPC associated with a scan-based test logic value and a time delay through the CPC associated with a functional logic value is greater than a time skew between two inputs to the CPC.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit, comprising:
    a path circuit gated by a contention prevention circuit (CPC); and
    the CPC,
        wherein the CPC prevents contention in the path circuit during a scan-based test,
        wherein the CPC allows functional operation to occur without adversely affecting a functional operation timing, provided that a time skew between two input signals to the CPC is approximately less than a difference between a time delay associated with a scan-based test logic value and a time delay associated with a functional logic value.

2. The circuit of claim 1, wherein the CPC comprises:
    a first plurality of parallel exclusive-not-or (XNOR) gates for comparing a first address and a second address;
    a first not-or (NOR) gate in parallel with the first plurality of XNOR gates for determining if the first and second addresses are both enabled for writes;
    a first plurality of not-and (NAND) gates coupled to the first plurality of XNOR gates and the first NOR gate; and
    an OR gate coupled to the first plurality of NAND gates, wherein the OR gate outputs a first signal indicating whether or not the first and second addresses will contend in the path circuit.

3. The circuit of claim 1, wherein the CPC comprises:
    a first, second, third, fourth, and fifth XNOR gates for comparing a first address and a second address;
    a first NOR gate in parallel with the first, second, third, fourth, and fifth XNOR gates, the first NOR gate having a first-address-enable-bar signal and a second-address-enable-bar signal as inputs;
    a first NAND gate coupled to the first, the second, and the third XNOR gate;
    a second NAND gate coupled to the fourth and the fifth XNOR gates, and to the first NOR gate; and
    an OR gate coupled to the first and second NAND gates, wherein the OR gate outputs a first signal indicating whether or not the first and second addresses will contend in the path circuit.

4. The circuit of claim 1, wherein the path circuit is guaranteed not to experience contention during functional mode.

5. The circuit of claim 2, wherein the CPC further comprises:
    a write-through-read collision logic, wherein the write-through-read collision logic outputs a second signal indicating whether or not the first and second addresses will contend in a write to a third address.

6. The circuit of claim 5, wherein write-through-read collision logic comprises an inverter.

7. The circuit of claim 5, wherein write-through-read collision logic comprises a third NAND gate.

8. The circuit of claim 5, wherein the path circuit comprises a write-through-read comparator, the write-through-read comparator comprising:
    a second plurality of parallel XNOR gates for comparing the first address and the third address;
    a second NOR gate in parallel with the second plurality of XNOR gates, wherein the second NOR gate has as inputs a first-address-write-enabled-bar signal, a third-address-read-enabled-bar signal, and the second signal;
    a second plurality of NAND gates coupled to the second plurality of parallel XNOR gates and the second NOR gate; and
    a third NOR gate coupled to the second plurality of NAND gates, wherein the third NOR gate outputs a third signal for blocking a write-through-read between the first and third addresses if the first and third addresses are the same address, the first address is enabled for a write, the third address is enabled for a read, and the second signal indicates that the first and the second addresses will contend in a write to the third address.

9. A circuit, comprising:
    a path circuit gated by a CPC; and
    the CPC,
    wherein the CPC prevents contention in the path circuit during a scan-based test,
    wherein the CPC allows functional operation to occur without adversely affecting a functional operation timing, provided that a time skew between two input signals to the CPC is approximately less than a difference between a time delay associated with a scan-based test logic value and a time delay associated with a functional logic value,
    wherein the CPC comprises:
        a first plurality of parallel XNOR gates for comparing a first address and a second address, a first NOR gate in parallel with the first plurality of XNOR gates for determining if the first and second addresses are both enabled for writes, a first plurality of NAND gates coupled to the first plurality of XNOR gates and the first NOR gate, and an OR gate coupled to the first plurality of NAND gates, wherein the OR gate outputs a first signal indicating whether or not the first and second addresses will contend in the path circuit.

10. A method for preventing contention in a path circuit during a scan-based test, comprising the steps of:

(a) providing a first and a second signal, wherein the first signal is to write to a first address, wherein the second signal is to write to a second address;

(b) providing a static logical value during functional mode, wherein the time skew is approximately less than a difference between a time delay associated with a scan-based test logic value and a time delay associated with a functional logic value;

(c) comparing the first address with the second address;

(d) determining if the first and second addresses are enabled for writes; and (e) outputting a first signal with a contention state if the first and second addresses are identical and enabled for writes.

11. The method of claim 10, further comprising:

(f) providing a third signal for a read to a third address;

(g) comparing the first address with the third address;

(h) determining if the third address is enabled for a read;

(i) outputting a second signal with a block state if the first and third addresses are identical, the first address is enable for a write, the third address is enabled for a read, and the first signal is output with a contention state, wherein the second signal blocks a write-through-read between the first and third addresses.

* * * * *